US008835998B2

(12) United States Patent
Simon et al.

(10) Patent No.: US 8,835,998 B2
(45) Date of Patent: Sep. 16, 2014

(54) COMPOSITIONALLY GRADED HETEROJUNCTION SEMICONDUCTOR DEVICE AND METHOD OF MAKING SAME

(75) Inventors: John Simon, Golden, CO (US);
Debdeep Jena, South Bend, IN (US);
Huili Xing, South Bend, IN (US)

(73) Assignee: University of Notre Dame du Lac, Notre Dame, IN (US)

( * ) Notice: Subject to any disclaimer, the term of this patent is extended or adjusted under 35 U.S.C. 154(b) by 0 days.

(21) Appl. No.: 12/967,892

(22) Filed: Dec. 14, 2010

(65) Prior Publication Data

US 2011/0235665 A1    Sep. 29, 2011

Related U.S. Application Data

(60) Provisional application No. 61/284,166, filed on Dec. 14, 2009.

(51) Int. Cl.
| | | |
|---|---|---|
| *H01L 29/66* | (2006.01) | |
| *H01L 21/02* | (2006.01) | |
| *H01L 29/201* | (2006.01) | |
| *H01L 29/861* | (2006.01) | |
| *H01L 33/32* | (2010.01) | |
| *H01S 5/30* | (2006.01) | |
| *H01S 5/323* | (2006.01) | |
| *H01L 29/20* | (2006.01) | |
| *H01S 5/042* | (2006.01) | |

(52) U.S. Cl.
CPC ...... *H01L 29/8613* (2013.01); *H01L 21/02579* (2013.01); *H01L 29/201* (2013.01); *H01L 21/02631* (2013.01); *H01S 5/305* (2013.01); *H01L 21/02389* (2013.01); *H01L 21/02433* (2013.01); *H01L 21/0251* (2013.01); *H01S 5/3063* (2013.01); *H01L 21/02458* (2013.01); *H01L 33/32* (2013.01); *H01S 5/32341* (2013.01); *H01L 29/2003* (2013.01); *H01S 5/0421* (2013.01); *H01L 21/0254* (2013.01)
USPC ................. 257/291; 257/11; 257/E33.016

(58) Field of Classification Search
CPC ............. H01L 21/0251; H01L 21/02579; H01L 29/201; H01L 29/2003; H01L 33/32
USPC ........... 257/76, 101, 185, 191, 335, 597, 257/E33.048, E29.332, E21.09, 11, 12, 85, 257/97, E51.01, E51.011, E51.015, 257/E33.016, E33.032, E31.067, E29.081
See application file for complete search history.

(56) References Cited

U.S. PATENT DOCUMENTS

| | | | | |
|---|---|---|---|---|
| 5,170,407 | A * | 12/1992 | Schubert et al. | 372/96 |
| 5,880,510 | A * | 3/1999 | Cockrum et al. | 257/442 |
| 6,603,184 | B2 * | 8/2003 | Lin et al. | 257/458 |
| 7,807,917 | B2 * | 10/2010 | Atanackovic | 136/236.1 |
| 2005/0142682 | A1 * | 6/2005 | Ishibashi et al. | 438/45 |
| 2006/0231860 | A1 * | 10/2006 | Mishra et al. | 257/192 |
| 2006/0255364 | A1 * | 11/2006 | Saxler et al. | 257/192 |
| 2007/0181869 | A1 * | 8/2007 | Gaska et al. | 257/14 |
| 2008/0299691 | A1 * | 12/2008 | Bhat et al. | 438/31 |
| 2009/0072272 | A1 * | 3/2009 | Suh et al. | 257/194 |
| 2010/0140660 | A1 * | 6/2010 | Wu et al. | 257/183 |

\* cited by examiner

*Primary Examiner* — Cuong Q Nguyen
*Assistant Examiner* — Yosef Gebreyesus
(74) *Attorney, Agent, or Firm* — Greenberg Traurig, LLP (57) ABSTRACT

A compositionally graded semiconductor device and a method of making same are disclosed that provides an efficient p-type doping for wide bandgap semiconductors by exploiting electronic polarization within the crystalline lattice. The compositional graded semiconductor graded device includes a graded heterojunction interface that exhibits a 3D bound polarization-induced sheet charge that spreads in accordance with $\rho_\pi(z) = -\nabla \cdot P(z)$, where $\rho_\pi(z)$ is a volume charge density in a polar (z) direction, and $\nabla$ is a divergence operator, wherein the graded heterojunction interface is configured to exhibit substantially equivalent conductivities along both lateral and vertical directions relative to the graded heterojunction interface.

15 Claims, 7 Drawing Sheets

COMPOSITIONALLY GRADED HETEROJUNCTION SEMICONDUCTOR DEVICE AND METHOD OF MAKING SAME

CROSS REFERENCE TO RELATED APPLICATION

This application is a non-provisional application claiming priority from U.S. Provisional Application Ser. No. 61/284,166, filed Dec. 14, 2009, entitled "Polarization-induced Hole Doping in Wide-Bandgap Uniaxial Semiconductor Heterostructures" and incorporated herein by reference in its entirety.

This non-non-provisional application has been supported under the Office of Naval Research (ONR) under grant # N00014-08-1-0417.

BACKGROUND

The direct-gap III-V nitride semiconductor family and its alloys span the widest spectral range of band gaps ($E_g$) among all semiconductors, ranging from the infrared (InN, $E_g$=0.7 eV) through the visible and the ultraviolet (UV) (GaN, $E_g$=3.4 eV) to the deep UV range (AlN, $E_g$=6.2 eV). This property is the basis for its applications in short-wavelength lasers and in light-emitting diodes (LEDs) for solid-state lighting applications. In addition, the wide band gaps, availability of heterojunctions, high electron-saturation velocities, and high breakdown fields enable high-speed and high-power electronic devices. Compact short-wavelength, solid-state light sources will enable a wide range of applications such as high-density optical data storage, water treatment, sterilization of medical equipment, UV-enabled security marks on credit cards and currency bills, and biological and cellular imaging.

Currently, the III-V nitride semiconductors offer the most viable approach toward the realization of high-efficiency, deep-UV optical emitters based on semiconductors. A problem that has persisted since the early 1990s and is becoming increasingly troublesome is the high resistivity of p-type GaN and AlGaN layers. The activation energy $E_A$ of the most commonly used acceptor dopant (Mg) in GaN is ~200 meV, several times the thermal energy $k_B T$ at room temperature (where $k_B$ is the Boltzmann constant, and T is temperature). The activation energy of acceptors increases with the band gap, reaching $E_D$~630 meV in AlN. For comparison, the donor (Si) activation energies are $E_D$~15 meV for GaN and $E_D$~282 meV for AlN. Thus, the thermal activation of holes is highly inefficient at room temperature for GaN and becomes increasingly problematic for higher-band-gap AlGaN and AlN layers. As a result, injection of holes is a severe impediment for light-emitting devices in the UV and deep-UV spectral windows. High p-type resistance leads to excessive Joule heating of p-doped AlGaN layers for Al composition $x_{Al} \geq 20\%$. Instead, p-GaN layers must be used and absorption losses incurred in the narrower-band-gap region. Furthermore, hole reflection and trapping at heterojunction valence-band offsets block hole injection into optically active AlGaN regions and reduce the efficiency of such devices. An alternative strategy for efficient p-type doping and hole injection in wide-bandgap semiconductors is therefore highly desirable at this time.

The large ionic component of the Ga(Al)—N bonds, combined with the deviation of their equilibrium lattice structure from ideal wurtzite crystals, give rise to giant spontaneous polarization fields in III-V nitride semiconductors. In addition, the strain-induced piezoelectric component of the fixed charge in the nitrides is the highest among all III-V semiconductors. At abrupt Al(Ga)N/GaN heterojunctions, the sharp discontinuity in the polarization field leads to the formation of a bound sheet charge $\sigma_\pi$ at the heterointerface, captured by the Gauss law boundary condition $\sigma_\pi = (P_1 - P_2) \cdot \hat{n}$, where $\hat{n}$ is the unit vector normal to the heterointerface, and $(P_1 - P_2)$ are the polarization fields across the heterojunction. When wurtzite nitride crystals are grown along the [0001] orientation (metal or Ga-face), a positive bound polarization charge creates a high electric field and energy-band bending, such that a mobile two-dimensional electron gas (2DEG) forms at AlGaN/GaN heterojunctions without the need for intentionally introduced impurity dopants. The bound sheet-charge density can be as high as $\sigma_\pi \sim 6 \times 10^{13}$ cm$^{-2}$ at pseudomorphic AlN/GaN heterojunctions, facilitating mobile 2DEGs with a very high charge carrier density. For example, in AlN/GaN semiconductor heterostructures, the mobile 2DEG concentrations are $4 \times 10^{13}$ cm$^{-2}$. Such polarization-induced 2DEGs form the basis of nitride high-electron mobility transistors that have surpassed transistors made from any other semiconductor family in RF power performance.

The polarization fields have also been exploited to create parallel sheets of 2D hole gases in Mg-doped AlGaN/GaN multiple-quantum-well structures. Although such parallel 2D hole sheets have high conductivity in the plane of the heterojunctions, they suffer from low conductivity perpendicular to the interfaces because of potential barriers in the valence band that require transport to occur through tunneling or thermionic emission processes. Even in short-period superlattice structures, the large effective mass of holes in minibands results in low mobility and high resistance. Therefore a need exist for an alternate strategy for hole doping without potential barriers that will facilitate higher conductivities.

BRIEF DESCRIPTION OF THE DRAWINGS

The disclosure will be better understood and aspects other than those set forth above will become apparent when consideration is given to the following detailed description thereof. Such description makes reference to the annexed drawings wherein:

FIG. 1 A-E depict schematic illustrations of polarization-included p-type doping in graded polar heterostructures;

FIG. 2 A-B depict structural and transport properties of p-type samples of the present application;

The same reference numerals refer to the same parts throughout the various figures.

DETAILED DISCUSSION

The present disclosure will now be described more fully with reference to the accompanying drawings, in which examples of the disclosure are shown. The disclosure may be, however, embodied in many different forms and should not be construed as being limited to these variations as set forth herein; rather, these examples are provided so that this disclosure will be thorough and complete, and will fully convey the concept of the disclosure to those of ordinary skill in the art.

The drawings are not necessarily to scale and in some instances proportions may have been exaggerated in order to more clearly depict certain features of the disclosure. Further, it should be understood that, although various steps of various the disclosed methods may be shown and described as being in a sequence or temporal order, the steps of any such method are not necessarily limited to being carried out in any particular sequence or order, absent an indication otherwise. That is, the method steps are to be considered to be capable of being carried out in any sequential combination or permutation order while still falling within the scope of the present disclosure.

If instead of sharp heterojunctions we grew a compositionally graded crystal, the bound polarization-induced sheet charge spreads to a bound 3D form in accordance with $\rho_\pi(z) = -\nabla \cdot P(z)$, where $\rho_\pi(z)$ is the volume charge density in the polar (z) direction, and $\nabla$ is the divergence operator. For [0001]-oriented Ga-face crystals graded from GaN to AlGaN, the polarization bound charge is positive and induces the formation of a mobile 3D electron gas. These 3D electron slabs are quite distinct from those formed by donor impurity doping: Because the carriers are created by effective electrostatic "field" ionization, they require no impurity incorporation, and thus exhibit virtually no freezeout at cryogenic temperatures as opposed to thermally ionized carriers in shallow, donor-doped layers. The resulting 3D electron gases have higher n-type conductivity than impurity-doped layers of comparable carrier concentration, because ionized impurity scattering is absent. The absence of freezeout and high mobilities made it possible to observe Shubnikov-de Haas oscillations. Polarization-induced field-effect transistors have also been demonstrated recently with this technique.

By the same measure, flipping the polarity of the crystal (growing along the N-face, which is the [000$\bar{1}$] direction) and compositional grading from GaN to AlGaN should result in mobile 3D hole slabs. The ability to do so without the introduction of Mg-acceptor dopants hinges on the propensity of the surface to act as a remote acceptor state. The surface of III-V nitride semiconductors freely provides mobile electrons, but not holes, and this difference has been attributed to the presence of deep-level traps that localize holes. Lowering of defect and trap densities may enable dopant-free p-type carriers, but intentionally introducing Mg-acceptor dopant atoms in the N-face graded AlGaN layer serves as the necessary source of holes. This work demonstrates the ability to use the polarization charges in N-face [000$\bar{1}$] layers to generate polarization-induced, p-type graded AlGaN slabs that are highly conductive.

Figure 1:
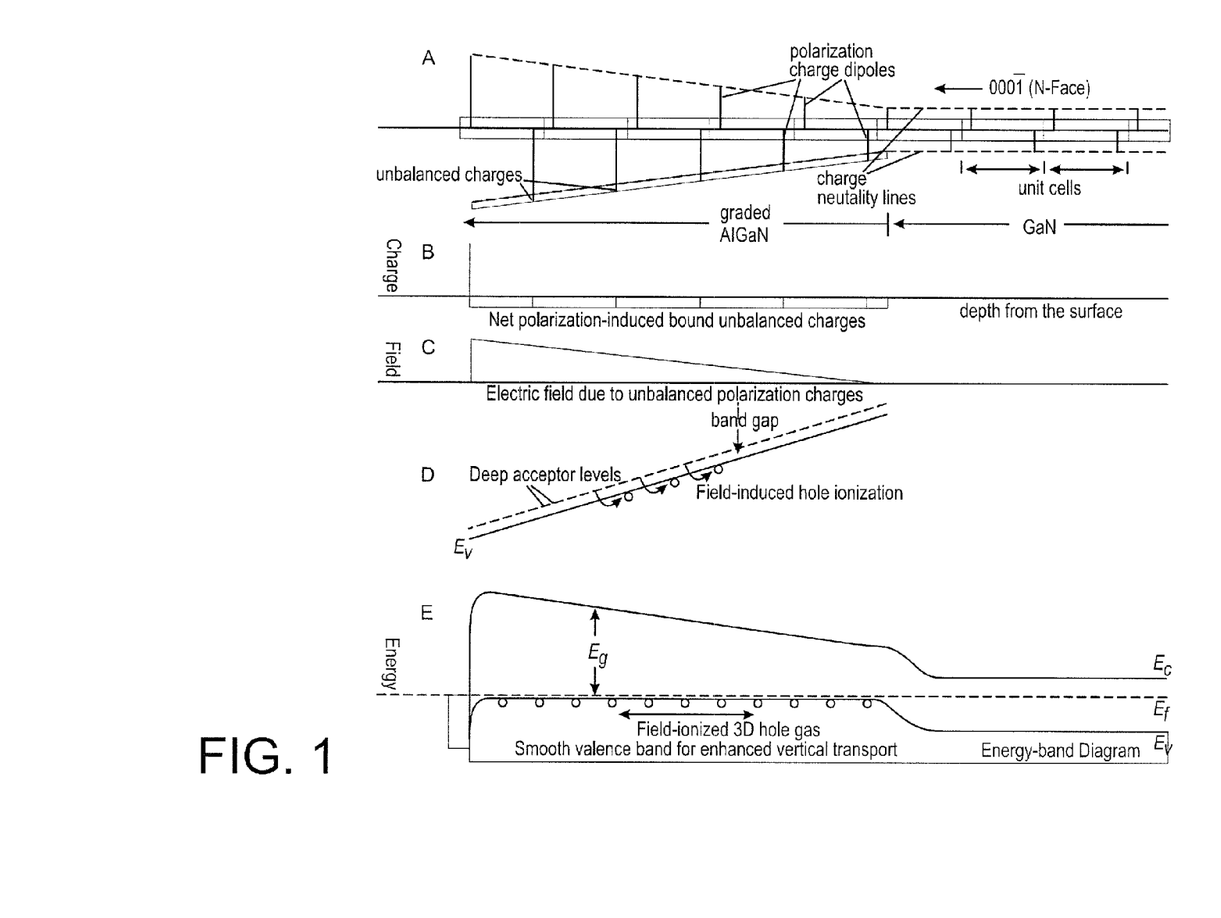

Referring now to FIG. 1 that depicts schematic illustration of polarization-induced p-type doping in graded polar heterostructures. (A) Sheets of charge dipoles in every unit cell of the crystal. The net unbalanced polarization charge is shown in (B), which leads to the electric field in (C), and the energy band bending in the valence band in (D) if holes are not ionized. Field ionization of holes results in a steady-state energy-band diagram shown in (E), which highlights the smooth valence-band edge without any potential barriers for hole flow. $E_F$ is the Fermi level; $E_C$ and $E_V$ are the conduction and valence-band edges, respectively; and $E_g$ is the band gap.

The mechanism of polarization-induced hole formation is illustrated schematically in FIG. 1. The total polarization (spontaneous plus piezoelectric) can be pictured as charge dipoles in every unit cell of the crystal (FIG. 1A). Because $Al_xGa_{1-x}N$ (where x is the Al mole fraction) has higher polarization than GaN, the sheet-charge dipoles in unit cells of the AlGaN layer are of a higher magnitude than in GaN, so the dipole strength increases linearly with the composition. When the composition of the layer is graded with increasing Al mole fraction, the net unbalanced bound polarization charge is negative (FIG. 1B), given by $\rho_\pi(z) = -\nabla \cdot P(z) \approx 5 \times 10^{13} \times (x_2-x_1)/d$ cm$^{-3}$, where $x_1$ and $x_2$ are the Al compositions at the ends of the graded layer of thickness d (in centimeters). This bound charge creates a built-in electric field (FIG. 1C) and energy-band bending that would be greater than the band gap of the semiconductor layer if left uncompensated (FIG. 1D). To neutralize the bound, negative polarization charge, holes are consequently field-ionized from the deep Mg-acceptor atoms and form a high-density mobile 3D hole gas. The concentration of the 3D hole gas should then exhibit a weak temperature dependence and resist freezeout at low temperatures. In addition, the smooth spatial variation of the valence-band edge (FIG. 1E) should further facilitate high-conductivity p-type transport in both lateral and vertical directions.

Figure 2:
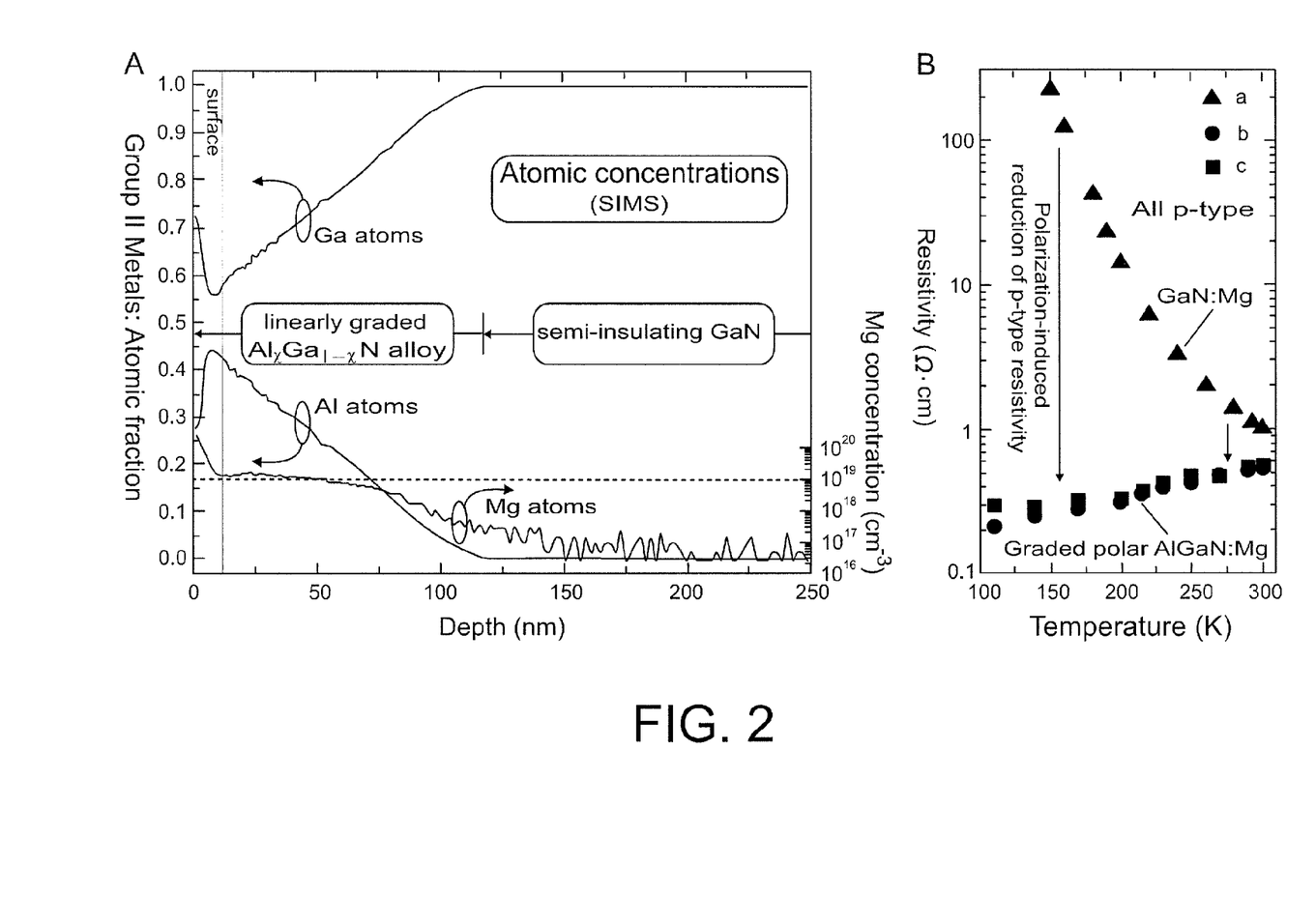

Referring now to FIG. 2 which depicts structural and transport properties of p-type samples (A) Concentration of Al and Ga atoms in a compositionally graded AlGaN sample (sample d), with the measured concentration of Mg dopant atoms. The thickness of the graded layer is d~85 nm, capped with a thin, heavily doped p++ layer for ohmic contacts. SIMS, secondary ion mass spectrometry. (B) Measured temperature-dependent resistivity for samples a to c, highlighting the polarization boost in p-type conductivity.

To test this concept of polarization-induced p-type doping, Mg-doped graded AlGaN layers were grown on top of semi-insulating N-face [000$\bar{1}$] GaN substrates by plasma-assisted molecular beam epitaxy. A Mg-doped GaN sample ($N_a$~10$^{19}$/cm$^3$, sample a; here, $N_a$ is the acceptor concentration) was used as a control sample. Graded AlGaN samples doped with the same Mg concentration but linearly graded from x=0 to 0.16 (sample b) and x=0 to 0.3 (sample c) over d~85 nm were grown. The sample structures and compositions were characterized by x-ray diffraction, in situ reflection, high-energy electron diffraction patterns and atomic force microscopy. Secondary ion mass spectrometry measurements were performed on a separate graded AlGaN sample (x=0 to 0.4, sample d) as well as the control Mg-doped GaN sample to verify the incorporation of Mg atoms into the crystal and the linear grading of Al composition in the polarization-doped AlGaN layers (FIG. 2A). Samples a to c were subsequently processed for Hall-effect measurements.

The measured resistivities of the bulk p-GaN and polarization-doped AlGaN layers from T=300 to 100 K are shown in FIG. 2B. The room-temperature resistivity of both polarization-doped samples b and c ($\rho_b, \rho_c$~0.6 ohm·cm) is lowered by more than a factor of 2 compared with that of the control sample a ($\rho_a$~1.22 ohm·cm). The resistivity of the control sample a increased monotonically by more than two orders of magnitude as the temperature was lowered from 300 to 100 K (FIG. 2B); this increase is expected from the freezeout of thermally activated holes. In comparison, the resistivities of the polarization-doped samples b and c actually decreased with temperature, which is indicative of metallic behavior. This decrease in resistivity can occur if (i) polarization-induced holes do not freeze out at low temperatures and (ii) the mobilities of polarization-induced holes increase when temperature is lowered from 300 to 100 K.

Figure 3:
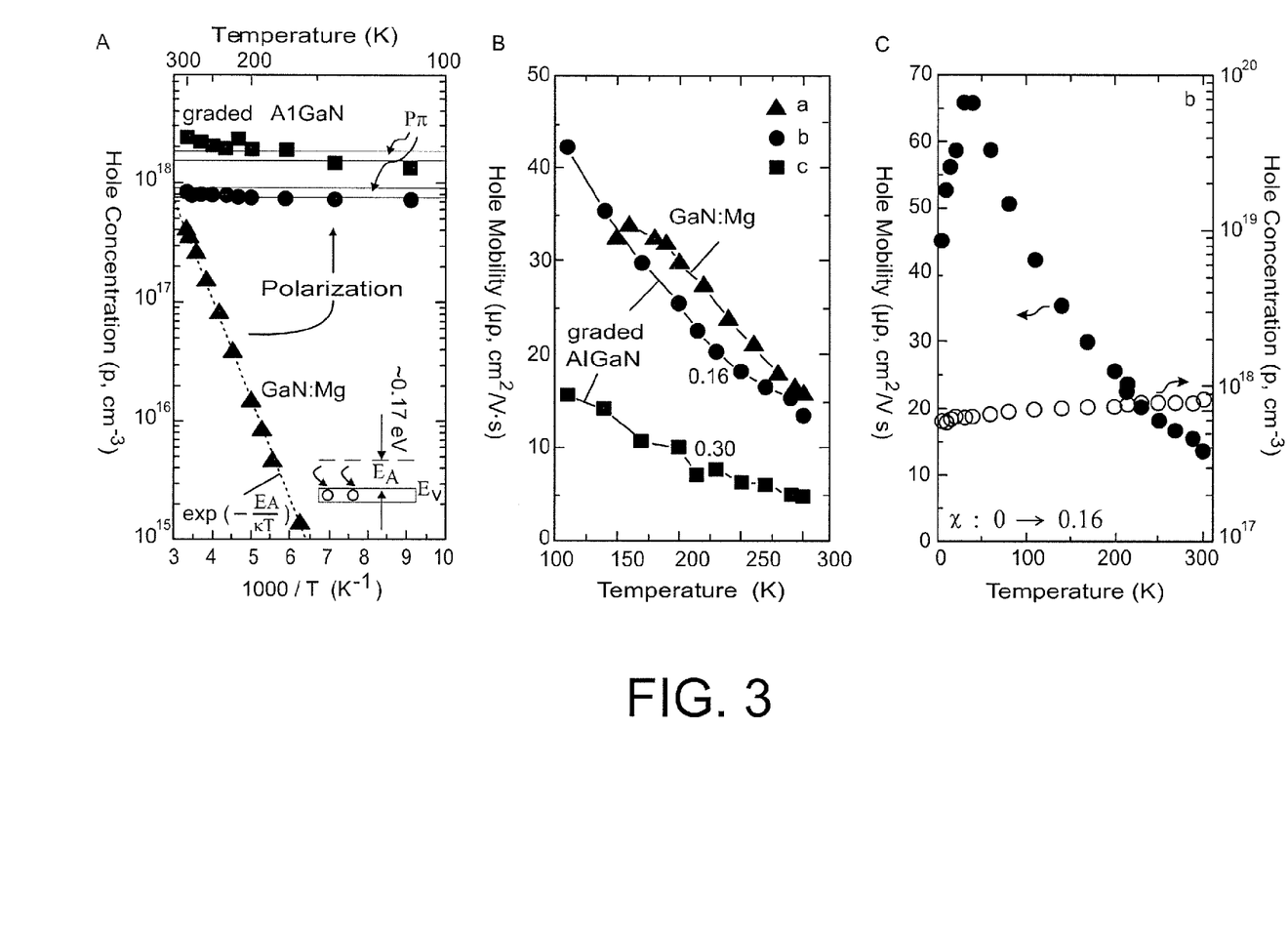
FIG. 3A-C depict Hall-effect temperature dependent hole concentrations and mobilities measured down to T=4K.

Referring now to FIG. 3 which depicts Hall-effect temperature-dependent (A) hole concentration, (B) hole mobilities, and (C) hole concentration and mobility measured down to T=4 K. The polarization-doped graded AlGaN p-type layers show higher hole concentrations and conductivities. Holes in polarization-doped layers are resistant to freezeout at low temperatures, and their mobility and concentration can be measured down to cryogenic temperatures.

Temperature-dependent Hall-effect measurements performed at a magnetic field of 0.5 T confirmed the two hypotheses. The measured hole concentrations and mobilities are shown in FIG. 3, A and B. Compared with the exponential freezeout (activation energy $E_A$~170 meV) of mobile holes for the Mg-doped GaN control sample (a), the hole densities in the polarization-induced graded AlGaN samples (b and c) remain essentially independent of temperature, and are near the theoretical prediction [$\rho_\pi \approx 5 \times 10^{13} \times (x_2-x_1)/d$ cm$^3$], as indicated by the thick gray lines in FIG. 3A. Polarization charges are atomic in origin and do not require thermal energy to be activated, so they enhance the hole concentration independent of temperature. In addition, because polarization charges are spatially distributed, the band-edge potential variations are smooth, and no abrupt potential barriers exist for the flow of holes along any direction. These properties are a major advantage and novelty of this method of p-type doping. Polarization enhancement of hole densities are 2× and 6× for samples b and c at room temperature and many orders of magnitude at lower temperatures.

The measured hole mobilities as a function of temperature in samples a to c are shown in FIG. 3B. Sample c has lower hole mobility because of increased alloy scattering. Although it was not possible to perform Hall-effect measurements for control sample a below T~150 K because of carrier freezeout, we measured the polarization-enhanced hole concentration and mobility down to T=4 K for sample b. As shown in FIG. 3C, the hole concentration showed a very small decrease with temperature, whereas the hole mobility increased to $\mu_p$~65 cm$^2$/V·s at 30 K before decreasing, indicating competition between phonon and impurity scattering.

Figure 4:
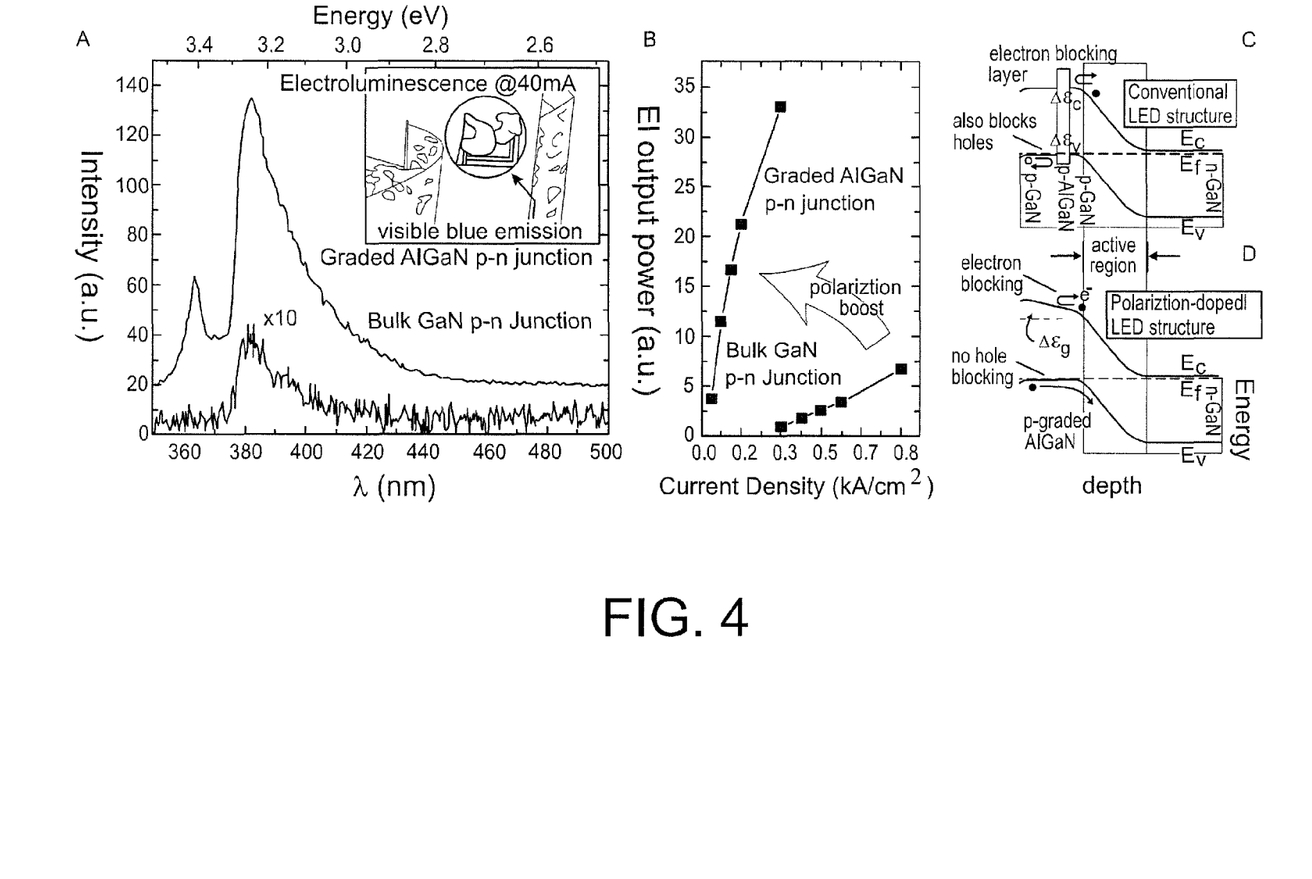
FIG. 4A-D depict various properties and energy bands of graded p-type AlGaN of the present application.

Referring now to FIG. 4. (A) which depicts room temperature electroluminescence of the graded p-type AlGaN junction and the control GaN p-n junction at 40-mA drive current. Both samples have an area of 80 μm by 150 μm. (Inset) Optical microscope micrograph displaying the blue part of the emission of the graded AlGaN junction. a.u., arbitrary units. (B) Relative output intensity with increasing drive current for the graded AlGaN p-n junction and the control bulk-doped p-n junction. The polarization-doped diode shows much brighter emission than the bulk-doped p-n junction. Schematic energy-band diagrams of a conventional (C) LED device and (D) a polarization-doped device. The graded AlGaN p-n junction uses the entire band offset $\Delta E_g$ in the conduction band as an electron-blocking layer, resulting in enhanced electroluminescence. In comparison, a traditional electron-blocking layer (C) also blocks holes through a valence-band offset $\Delta E_V$.

To test the effectiveness of such polarization-enhanced p-type layers as hole injectors in optical devices, a Mg-doped graded AlGaN layer (x=0 to 30%, identical to sample c) was grown on a n-type doped N-face [000$\bar{1}$]-oriented GaN substrate. A control p-n junction with a Mg-doped GaN p-type layer was also grown, and these structures were fabricated into light-emitting diode structures. These junctions serve as prototype LEDs, requiring electrical injection of holes and electrons into the depletion region where they recombine radiatively to emit photons. Under forward bias at room temperature, both devices exhibit electroluminescence in the UV spectral range (FIG. 4A). We observed characteristic sub-band-gap emission attributed to deep acceptor levels in nitrides. Furthermore, we note that the graded AlGaN p-layer structure showed much brighter optical emission (FIG. 4B), which we attribute to two factors: (i) improved p-type conductivity in the vertical direction due to polarization-induced hole doping and (ii) the existence of a built-in quasi-electric field imposed on minority electrons injected into the p-type layer of the graded AlGaN. The compositional grading in the p-type AlGaN layer causes the increase in the band gap $\Delta E_g$ to appear entirely in the conduction band, which acts as a natural electron-blocking layer. This feature is shown in the energy-band diagram in FIG. 4D. Electron-blocking layers have been shown to improve the efficiency of emission by preventing the spillover of higher mobility electrons from the optically active regions of nitride LEDs. Conventional electron-blocking layers implemented in nitride LEDs and lasers consist of a thin AlGaN layer placed on the p-doped side [schematic band diagram shown in FIG. 4C]. In addition to blocking electron overflow through a conduction band barrier $E_C$, such layers also prevent efficient hole injection because of the unavoidable valence-band offset $E_V$. Polarization-doped graded layers provide a solution to this design bottleneck. In addition to improving the p-type conductivity, the polarization-induced graded p-type AlGaN layer facilitates electron blocking without adding barriers to hole injection and offers an added degree of freedom in graded-refractive-index design, all of which are useful for UV laser applications. The polarization-doped layer is also of a larger band gap than the active region of the p-n junction and serves as a natural optically transparent layer with minimal absorption losses.

This method of polarization doping should prove particularly useful for deep-UV optoelectronic applications where both p- and n-type doping of high Al composition AlGaN is a major challenge. The technique presented here could be applied to produce highly conductive p-type regions in wide-band-gap nitrides composed of high-Al composition AlGaN and in the more general AlInGaN material system with proper choice of the crystal direction of growth and management of strain within allowable limits. The doping scheme can be used to obtain desired hole or electron concentrations in spite of poor ionization efficiencies of deep-level dopants in any semiconductor crystals that possess sufficiently strong spontaneous and piezoelectric polarization (for example, in the ZnO material family).

Experimental Details and Examples

Crystal growth of the III-V nitride semiconductor layers studied in this work were performed in a Veeco Gen-930 plasma-assisted molecular beam epitaxy (MBE) system. The starting substrates were semi-insulating N-face [000$\bar{1}$] oriented GaN substrates obtained from Kyma for transport studies, and n-type doped N-face GaN substrates obtained from LumiLog for prototype light-emitting diode structures. Note that these N-Face structures are distinct from the more widely used Ga-face [0001]-oriented substrates. The GaN substrates were cleaned by ultrasonication in three organic solvents—acetone, methanol and isopropanol in succession, and were mounted on 3" lapped Silicon wafers with high purity molten indium as the adhesive. The samples were then outgassed at 200° C. and 450° C. successively in separate ultra high vacuum chambers of the MBE system prior to the growth of the reported heterostructures.

MBE growth was performed using metal atoms provided by high-purity Ga, Al, and Mg effusion cells, and active nitrogen atoms from a high-purity gas source flowing through a RF plasma. The growths were performed at a thermocouple temperature of $T_{TC}$~600° C., and a RF plasma power of 275 W. The Ga atomic flux used resulted in an effective beam-equivalent pressure of $F_{Ga}$~10$^{-7}$ Torr at the substrate location.

The effective Al atom flux was varied linearly by changing the effusion cell temperature with a computer program for obtaining the graded AlGaN layers for polarization-induced doping. These growth conditions resulted in a growth rate of ~140 nm/hr. The polarization-doped samples consisted of d=85 nm thick Mg doped nitride layers in which the composition was graded form GaN to $Al_xGa_{1-x}N$. The aluminum compositions of the top surface was designed to be x=0.16 for sample B and 0.30 for sample C. A Mg doped GaN structure (sample A) grown under the same conditions was used as a control sample. The effective Mg doping concentration in the samples was $N_A$~$6\times10^{18}$ cm$^{-3}$ as verified from secondary-ion mass spectrometry (SIMS) measurements. The results of a similar SIMS measurement on a separate graded AlGaN sample (sample D) reported in FIG. 2(a) showed a small degree of spatial variation of acceptor dopant incorporation, which is attributed to the measurement technique. The variation observed is not large enough to raise concerns about the results presented here. The p-type GaN and graded AlGaN layers were capped with a heavily doped p-type layer for improved ohmic contacts.

Figure 5:
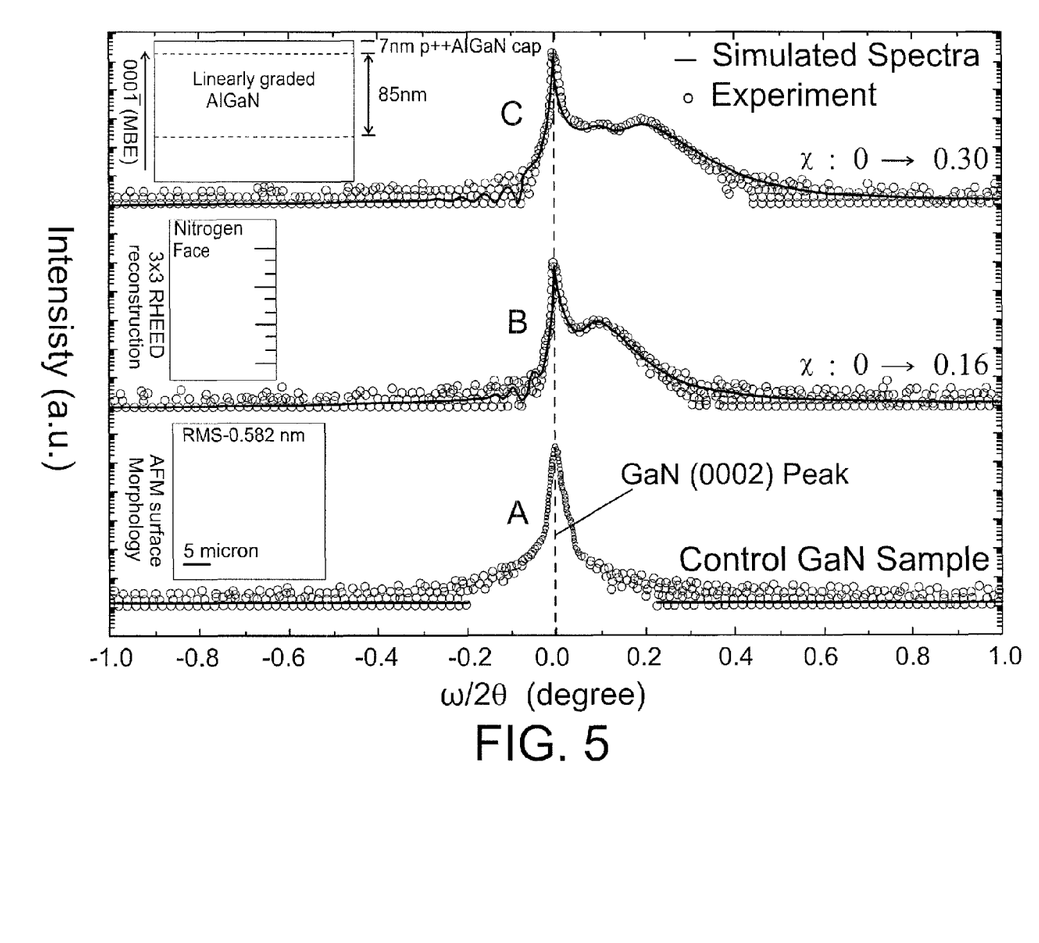
FIG. 5 depicts XRD measurements of diffraction pattern intensity of samples of the present application.

Referring now to FIG. 5 which depicts structure properties of p-type samples. The aluminum composition was varied linearly over 85 nm for samples B and C and capped with a thin p++ layer for ohmic contacts as shown in top left schematic. XRD measurements show good control of layer compositions and thickness. The close match between the experimental and simulated X-ray diffraction patterns highlight the high degree of control obtained in the crystal growth. The inserts show the RHEED and AFM images, showing smooth epitaxial layers and evidence of growth in the N-face direction in the 3×3 RHEED reconstruction.

3×3 surface reconstructions were observed by in-situ reflection high-energy electron diffraction (RHEED) in the MBE system after growth of the heterostructures. This is conclusive evidence of the N-face surface (FIG. 5, insert). After growth, the samples were unloaded and atomic force microscopy (AFM) scans were performed on the sample surfaces. The scans showed highly smooth surface morphologies with typical RMS height variation of ~0.6 nm over a 30×30 µm² scan area. X-ray diffraction (XRD) measurements were performed for samples A, B and C in a Panalytical high resolution XRD system using Cu—Kα line and scanning around the (0002) peak of the wurtzite crystal structure of GaN and AlGaN heterostructures. Comparing the measured data with the simulated X-Ray diffraction patterns confirmed that the graded layer compositions and thicknesses were accurately controlled in the MBE growth, and high-quality pseudomorphic AlGaN layers were successfully grown.

Figure 6:
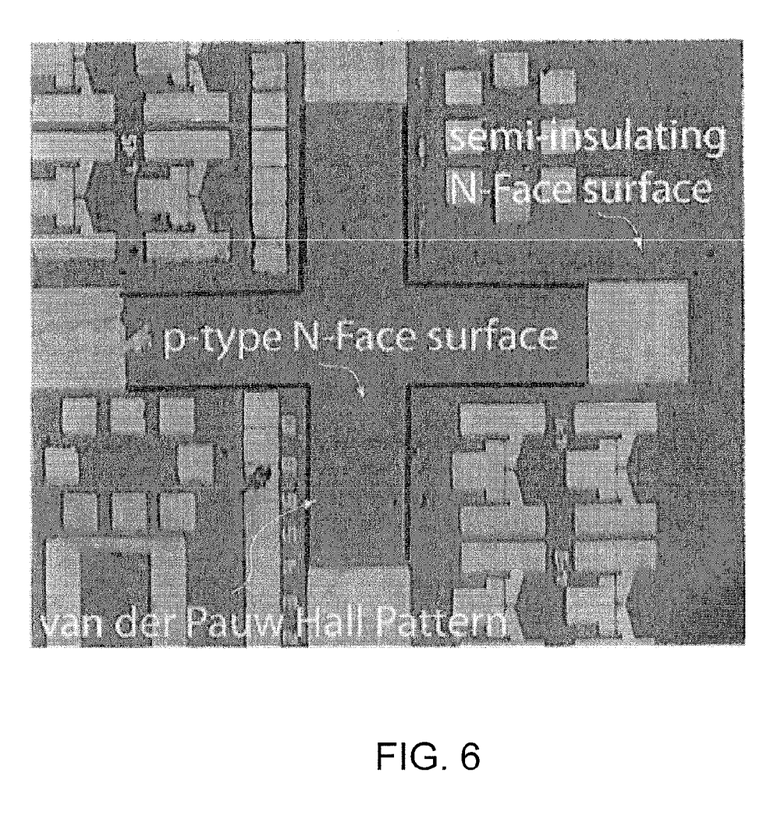
FIG. 6 depicts an optical microscopic image of a van der Pauw Hall effect pattern used in transport studies of the present application.

Referring now to FIG. 6 which depicts optical microscope image of the van der Pauw Hall-effect pattern used in transport studies. The samples were then processed into van-der Pauw patterns (FIG. 6) for Hall effect measurements by lithographic patterning and etching down to the semi-insulating substrates using $Cl_2$ plasma in a reactive ion etcher (RIE), Ni/Au metal layers were deposited in an electron beam evaporator for ohmic contacts to the p-type layers. Ohmic contact resistivities of $3.6\times10^{-3}$ and $9.3\times10^{-3}$ ohm·cm² were extracted from transmission line method (TLM) measurements for the bulk doped GaN sample (A) and 30% graded sample (C) respectively. As the Al composition of the graded layer increased, the ohmic contacts become less linear due to the larger bandgap of the top contact layer, as is observed typically in III-V nitride optical devices.

Figure 7:
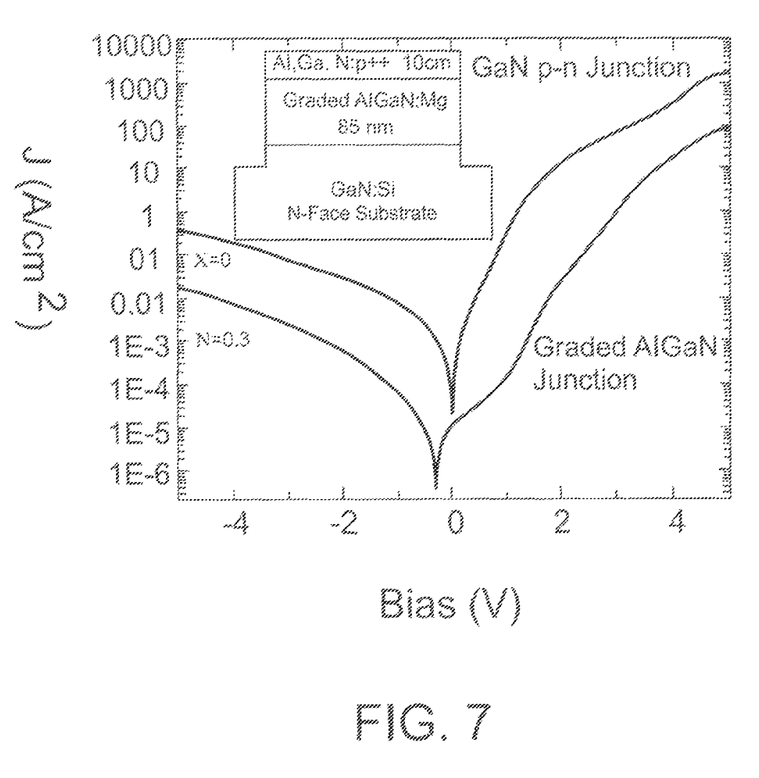
FIG. 7 depicts current voltage characteristics of graded heterojunctions of the present application.

Also referring now to FIG. 7 which depicts room temperature current-voltage characteristics for a GaN bulk doped p-n junction (blank), and a p-type graded (0 to 30%) AlGaN/n-GaN p-n junction. Insert shows the sample structure of a graded p-AlGaN diode.

The polarization-doped p-n junction (LED) sample consisted of a d=85 nm thick layer of AlGaN graded from 0 to 30%, with a Mg doping concentration of $N_A$~$5.6\times10^{18}$ cm$^{-3}$ grown on a n-type N-Face GaN substrate. The sample was capped with a heavily doped p-type $Al_{0.3}Ga_{0.7}N$ layer for improved contacts. A control Mg-doped GaN p-n junction was also grown under the same conditions and doping densities. The samples were processed by lithographic patterning and etching down to the n-type regions using $Cl_2$ plasma in a RIE system, and Ni/Au and Ti/Au contacts were used as the ohmic contacts to the p and n-type regions respectively. Both diodes showed large current rectification with on/off ratios of ~5000-15,000 measured at −5/5 Volt bias points (FIG. 7) The control GaN p-n homojunction allowed higher current densities at similar bias voltages since a) it is a homojunction whereas the graded p-n device is a heterojunction which will result in blocking of electron injection into the p-AlGaN layer (FIG. 4d), and b) a lower p-type ohmic contact resistance because of the lower bandgap of the p-type GaN cap layer as compared to $Al_{0.3}Ga_{0.7}N$ cap layer for the polarization-doped LED structure.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. A compositionally graded semiconductor device comprising:
   a graded heterojunction interface comprising a 3D net unbalanced bound polarization-induced sheet charge in every unit cell of a crystal that spreads in accordance with $\rho_\pi(z) = -\nabla \cdot P(z)$, where $\rho_\pi(z)$ is a volume charge density in a polar (z) direction, and $\nabla$ is a divergence operator,
   wherein the graded heterojunction interface comprises polarization-induced doping that provides for high conductivity p-type layers having a high density of holes and comprising a smooth spatial variation of a valence-band edge to exhibit substantially equivalent conductivities along both lateral and vertical directions relative to the graded heterojunction interface.

2. The device of claim 1, wherein the compositionally graded heterojunction interface is non-abrupt.

3. The device of claim 1, wherein the graded heterojunction interface is configured to exhibit high-conductivity p-type transport in both the lateral and vertical directions.

4. The device of claim 1, wherein the graded heterojunction interface comprises a GaN to $Al_xGa_{1-x}N$ graded heterojunction interface at an N-face along a [000$\bar{1}$] direction in which x is a mole fraction of Aluminum.

5. The device of claim 4, wherein the mole fraction of Aluminum is between $0.1 \leq x \leq 0.4$.

6. The device of claim 1, wherein the graded heterojunction interface comprises a AlN to $Al_xGa_{1-x}N$ graded heterojunction interface at an N-face along a [000$\bar{1}$] direction.

7. The device of claim 1, wherein the graded heterojunction interface comprises a AlInGaN graded heterojunction interface at an N-face along a [000$\bar{1}$] direction.

8. The device of claim 1, wherein the graded heterojunction interface is doped exhibits p-type characteristics.

9. The device of claim 1, wherein the graded heterojunction interface is also doped with a p-type doping agent comprising Mg.

10. The device of claim 1, wherein the graded heterojunction interface is configured to exhibit resistivities that decrease with temperature between 300 to 100 K.

11. The device of claim 1, wherein the graded heterojunction interface is configured to be not prone to hole freezeout at 4 K.

12. The device of claim 1, wherein the graded heterojunction interface is configured to hole mobility $\mu_p \sim 65$ cm$^2$/Vs at 30 K.

13. The device of claim 1, wherein the graded heterojunction interface comprises III-V semiconductors.

14. The device of claim 1, wherein the graded heterojunction interface comprises III-V nitride semiconductors.

15. The device of claim 1, wherein the device comprises selected from the group consisting of a LED device, a pn diode device and a laser diode device.

* * * * *